(12) United States Patent
Franceschini et al.

(10) Patent No.: US 8,144,508 B2
(45) Date of Patent: Mar. 27, 2012

(54) MEMORY READING METHOD FOR RESISTANCE DRIFT MITIGATION

(75) Inventors: Michele M. Franceschini, White Plains, NY (US); John P. Karidis, Ossining, NY (US); Luis A. Lastras, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/984,682

(22) Filed: Jan. 5, 2011

(65) Prior Publication Data

US 2011/0096594 A1    Apr. 28, 2011

Related U.S. Application Data

(62) Division of application No. 12/392,032, filed on Feb. 24, 2009, now Pat. No. 7,929,338.

(51) Int. Cl.
*G11C 11/00* (2006.01)

(52) U.S. Cl. .......................... 365/163; 365/148
(58) Field of Classification Search .................. 365/148, 365/163
See application file for complete search history.

*Primary Examiner* — Ly D Pham
(74) *Attorney, Agent, or Firm* — Ido Tuchman; Brian P. Verminski

(57) ABSTRACT

Techniques for reading phase change memory that mitigate resistance drift. One contemplated method includes apply a plurality of electrical input signals to the memory cell. The method includes measuring a plurality of electrical output signals from the memory cell resulting from the plurality of electrical input signals. The method includes calculating an invariant component of the plurality of electrical output signals dependent on the configuration of amorphous material in the memory cell. The method also includes determining a memory state of the memory cell based on the invariant component. In one embodiment of the invention, the method further includes mapping the plurality of electrical output signals to a measurements region of a plurality of measurements regions. The measurements regions correspond to memory states of the memory cell.

21 Claims, 10 Drawing Sheets

MEMORY READING METHOD FOR RESISTANCE DRIFT MITIGATION

CROSS-REFERENCE TO RELATED APPLICATIONS

This application is a divisional application claiming benefit under 35 U.S.C. §120 to the filing date of U.S. patent application Ser. No. 12/392,032 filed Feb. 24, 2009, the entire text of which is specifically incorporated by reference herein.

BACKGROUND OF THE INVENTION

1. Field of the Invention

The present invention relates to reading computer memory, and more specifically to reading phase change memory exhibiting resistance drift over a period of time.

2. Description of Background

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element. The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

Altering the phase change material's state requires heating the material to a melting point and then cooling the material to one of the possible states. A current passed through the phase change material creates ohmic heating and causes the phase change material to melt. Melting and gradually cooling down the phase change material allows time for the phase change material to form the crystalline state. Melting and abruptly cooling the phase change material quenches the phase change material into the amorphous state.

In multi-bit storage, an individual phase change memory cell must be able to be programmed to multiple states. These multiple states are various ratios of amorphous phased and crystalline phased phase change material. The ratio of amorphous to crystalline phase change material directly affects the electrical resistance of the memory cell.

A problem in phase change memory is resistance drift of the memory cells. As used herein, the resistance drift is the process through which the resistance of one phase of the phase change material changes with time. The resistive properties of the amorphous phase of phase change material, over a period of time, exhibits random drift and can make it difficult to recover the data stored in the memory cell. Thus, it is desirable to devise a method for reading and storing data in phase change memory cells independent of the characteristic resistance drift of the memory cells.

SUMMARY OF THE INVENTION

One aspect of the invention is a method for operating a memory cell. A memory state of the memory cell is represented by a configuration of amorphous material in the memory cell. A resistance of the memory cell drifts over a period of time. The method includes applying a plurality of electrical input signals to the memory cell. The method includes measuring a plurality of electrical output signals from the memory cell. The electrical output signals result from the plurality of electrical input signals. The method includes calculating an invariant component of the plurality of electrical output signals dependent on the configuration of amorphous material in the memory cell. The invariant component is substantially independent of a resistance drift characteristic of the memory cell over the period of time. The method also includes determining a memory state of the memory cell based on the invariant component.

Another aspect of the invention is a method for operating a memory cell. A memory cell state is represented by a configuration of amorphous material in the memory cell. A resistance of the memory cell drifts over a period of time. The method includes applying at least one periodic input signal to the memory cell. The method includes measuring an amplitude of at least one harmonic frequency resulting from the application of a periodic input signal. The measured amplitude of the harmonic frequency results from the at least one periodic input signal. The method includes calculating an invariant component based on the amplitude of the at least one harmonic frequency resulting from the at least one periodic input signal. The invariant component is dependent on the configuration of amorphous material in the memory cell and substantially independent of a resistance drift characteristic of the memory cell over the period of time. The method also includes determining the memory state of the memory cell based on the invariant component.

Another aspect of the invention is a memory controller for operating a memory cell. A memory cell state is represented by a composition of material in the memory cell. A resistance of the memory cell drifting over a period of time. The memory controller includes a biasing unit configured to bias a memory cell with a plurality of electrical input signals. The memory controller includes a measuring unit configured to measure a plurality of electrical output signals from the memory cell. The electrical output signals result from the plurality of electrical input signals. The memory controller includes a calculating unit configured to calculate an invariant component of the plurality of electrical output signals dependent on the configuration of amorphous material in the memory cell and substantially independent of a resistance drift characteristic of the memory cell over the period of time. The memory controller also includes a determining unit configured to determine a memory state of the memory cell based on the invariant component of the plurality of output electrical signals.

Yet another aspect of the invention is a computer program product embodied in a computer usable memory. The computer program product includes computer readable program codes coupled to the computer usable medium for operating a memory cell. A memory cell state is represented by a configuration of amorphous material in the memory cell. A resistance of the memory cell drifts over a period of time. The computer readable program codes are configured to cause the program to apply a plurality of electrical input signals to the memory cell. The computer readable program codes are configured to cause the program to measure a plurality of electrical output signals from the memory cell. The plurality of electrical output signals result from the plurality of electrical input signals. The computer readable program codes are configured to cause the program calculate an invariant component of the plurality of electrical output signals dependent on the configuration of amorphous material in the memory cell and substantially independent of a resistance drift characteristic of the memory cell over the period of time. The computer readable program codes are also configured to cause the program determine a memory state of the memory cell based on the invariant component.

Another aspect of the invention is a memory device comprising a plurality of memory cells. Each memory cell includes a memory state represented by a configuration of amorphous material in the memory cell, with the resistance of the memory cell drifting over a period of time. The memory device also includes a controller configured to (a) receive an address specifying a memory location to be read; (b) select the memory cell specified; (c) apply a plurality of electrical input signals to the memory cell; (d) measure a plurality of electrical output signals from the memory cell resulting from the plurality of electrical input signals; (e) calculate an invariant component of the plurality of electrical output signals dependent on the configuration of amorphous material in the memory cell, the invariant component being substantially independent of a resistance drift characteristic of the memory cell over the period of time; and (f) determine a memory state of the memory cell based on the invariant component.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
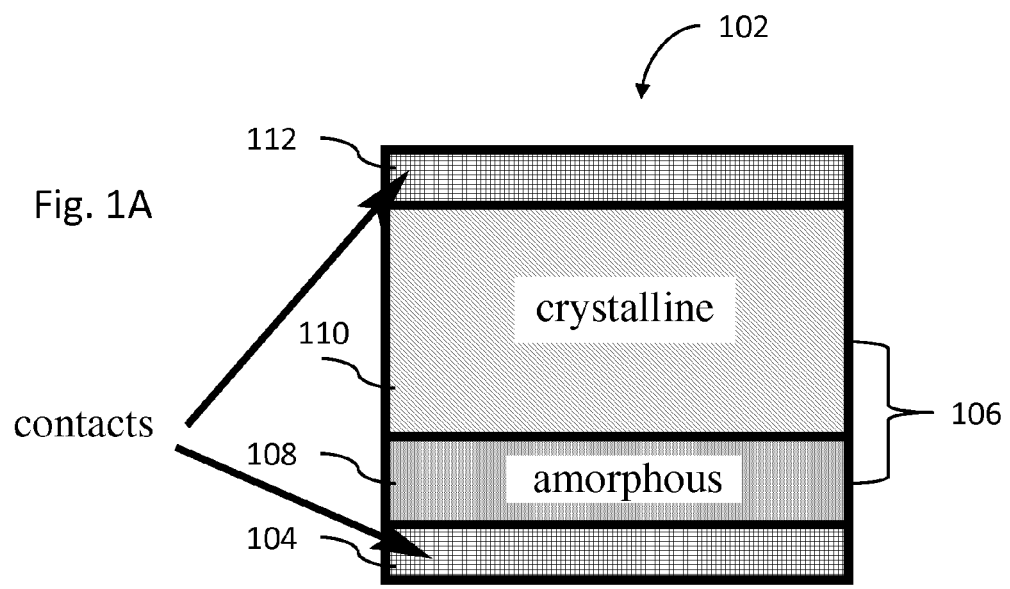
FIGS. 1A and 1B illustrate models of a phase change memory cell contemplated by the present invention.

The present invention is described with reference to embodiments of the invention. Throughout the description of the invention reference is made to FIGS. 1-6.

An embodiment of the current invention is a method for reading phase change memory over a period of time. In phase change memory, a state of the memory cell is represented by a composition of material in the memory cell. For example, in a four state phase change memory cell, the binary 00 state may be represented by 0% amorphous material, the binary 01 state may be represented by 25% amorphous material, the binary 10 state may be represented by 50% amorphous material, and the binary 11 state may be represented by 75% amorphous material.

Furthermore, during the period of time the phase change memory exhibits resistance drift (changes in electrical resistance). Unlike conventional memory configurations for reading memory, embodiments of the present invention read a memory cell's state by determining an invariant component of two or more detected signals from the memory cell, or alternately use a periodic input signal to obtain harmonics that convey information about the state of the cell. As described in more detail below, the invariant component is dependent on the composition of the memory cell and is substantially independent of the resistance drift occurring in the memory cell over the period of time.

In a particular configuration of the invention, the memory cells include phase change material, such as Germanium-Antimony-Tellurium (GST), whose composition of amorphous and crystalline material can be adjusted. That is, an amount of amorphous or crystalline material is used to represent data in the memory cell. The memory cells can therefore be programmed to one of at least two states. Each state is represented by a distinct ratio of crystalline to amorphous material. The ratio of crystalline to amorphous material can be read as an amount of crystalline material, an amount of amorphous material, or as a characteristic of the ratio of crystalline to amorphous material. It is emphasized that application of embodiments of the present invention is not limited to memory cells using GST type phase change memory. It is also important to note that associating the state of a cell to a ratio is an oversimplification as it is possible for two cells to have the same ratio yet very distinct particular configurations between amorphous and crystalline material. For this reason, we shall refer to the configuration of amorphous material in a cell in order to describe a cell's state. Even though the resistance of the amorphous material may drift over time, the configuration itself is not changing (at least with respect to the particular drift phenomenon that we are attacking) and thus the configuration is a good entity to associate with a state.

Extensive studies have been done on the electrical characteristics of the amorphous and crystalline states of phase change materials. One insight obtained from these studies is that the resistance characteristics of the amorphous material is highly nonlinear. That is, the current that passes through a cell in an amorphous state does not grow proportionally (linearly) with the voltage that to which the cell is subject. On the other hand, it is known that the crystalline state of a phase change material has very different electrical characteristics than the amorphous material, in particular following a more linear relation between current and voltage. Because the state of a cell is comprised by a configuration of an amorphous material together with the associated crystalline material, it is seen that information about the state of the cell can be obtained by stimulating the cell at multiple distinct operating points of the cell's current/voltage relation. Embodiments of the present invention utilize this operational property to develop a technique for combating drift and more generally, characterizing the state of a cell more accurately than conventional one measurement cell readings.

Figure 1B:
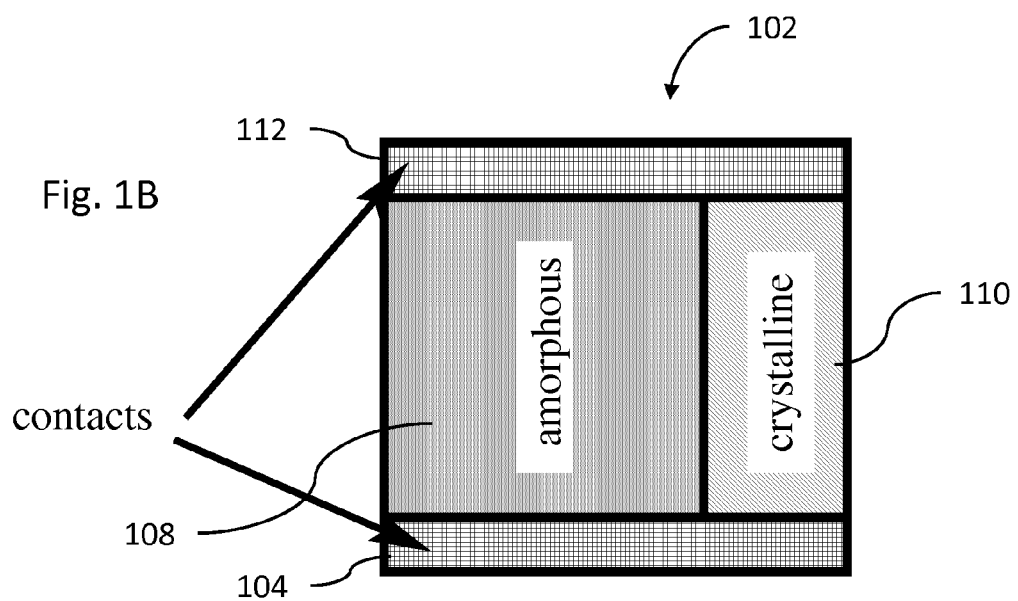

In FIG. 1A, a model 102 of a phase change memory cell is shown. The model 102 includes a bottom electrode 104, phase change material 106, and a top electrode 112. The phase change material 106 is comprised of amorphous material 108 and crystalline material 110. As illustrated, the amorphous material 108 and the crystalline material 110 are in series circuit with respect to the bottom electrode 104 and the top electrode 112. It is noted this model 102 is a broad generalization of an actual phase change memory cell. In FIG. 1B, the amorphous material 108 and the crystalline material 110 is shown configured in parallel circuit with respect to the bottom electrode 104 and the top electrode 112. In other embodiments (not illustrated) the amorphous material 108 can be formed within the crystalline material 110 and vice versa. As alluded to earlier, one may generally think of distinct configurations for the amorphous material in a memory cell.

Distinct ratios of crystalline material 110 to amorphous material 108 exhibit distinct characteristics. For example, as the amount of amorphous material 108 is increased, the resistance between the bottom electrode 104 and the top electrode 112 also increases. Over a particular period of time, however, the resistance of any ratio of crystalline material 110 to amorphous material 108 exhibits resistance drift. The resistance initially stored or programmed at the memory cell changes in a random fashion. Thus, the memory cell's resistance alone may no longer be an accurate representation of data stored.

Figure 2:
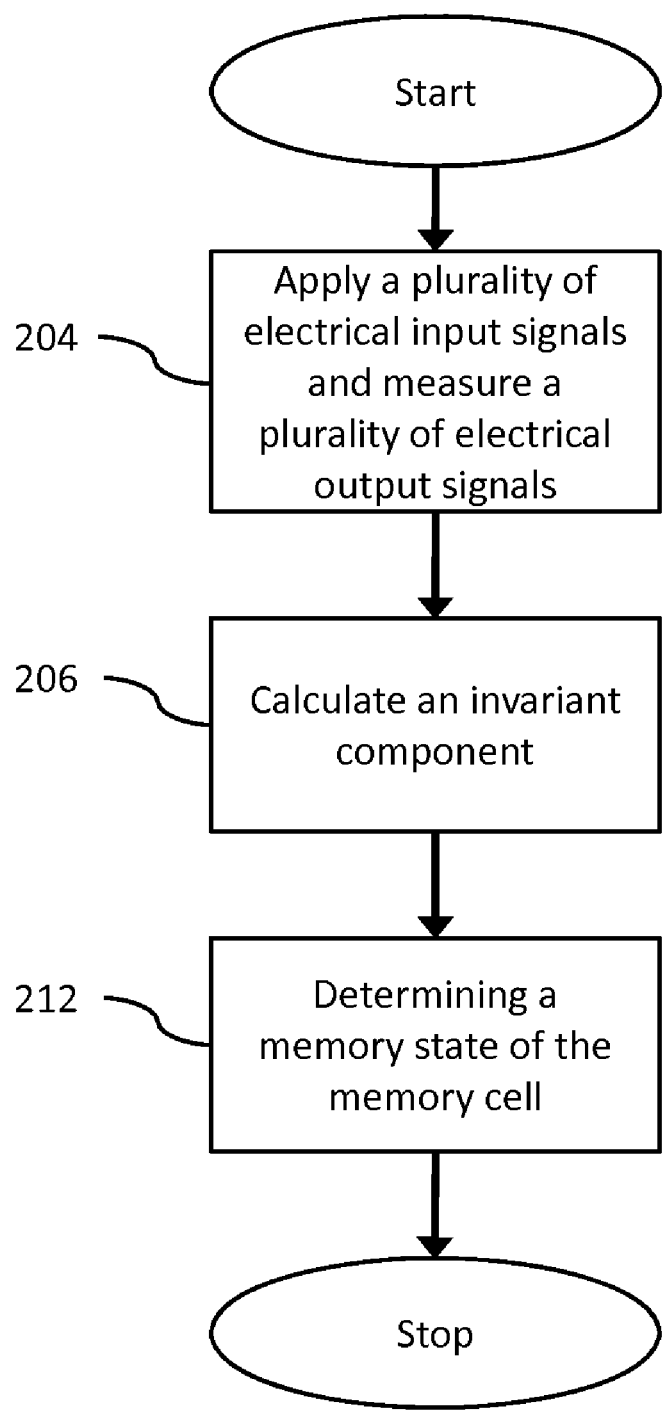
FIG. 2 illustrates process for reading phase change memory contemplated by the present invention.

Turning to FIG. 2, an example flowchart for reading a phase change memory cell is illustrated. The memory cell is programmed to one of at least two states represented by the composition of material in the memory cell. For example, the composition of material may be a configuration of amorphous material in the memory cell. The process flow begins at applying operation 204. During applying operation 204, a plurality of electrical input signals is applied to the memory cell. The plurality of electrical input signals bias the memory cell at more than one point of the phase change memory cell's current-voltage characteristic relation. That is, each electrical input signal is set to a distinct voltage such that the current or resistance through and out of the phase change material is distinct.

Those skilled in the art will recognize that a variety of methods for applying the plurality of electrical input signals can be utilized for the applying operation 204. For example, a plurality of distinct electrical input signals (two or more) can be applied (0.2V, 0.5V, 0.7V) where distinct currents or resistances can be read. Alternatively, a continuum of electrical input signals can be applied such that a continuous curve of currents or resistances can be obtained which may be subsequently converted into a sequence of samples using a circuitry that may perform several integration and sampling steps. The applying operation 204 further includes measuring the plurality of resulting electrical output signals.

In one embodiment of the invention, the continuum of electrical input signals is in the form of a sinusoid or other periodic signal, and the sampling circuitry measures the amplitude of various frequency components present in the output signal. When a periodic signal is applied to a nonlinear system, the frequency spectrum of the output signal will be different than the frequency spectrum of the input signal. For example, if a single sine wave is applied to a system having a quadratic response (that is, one in which a doubling of the input signal produces a quadrupling of the output signal), the output of the system will contain both the original frequency and a generated component at twice the original frequency. Therefore, one method of measuring the nonlinear behavior of the PCM cell is to apply a periodic signal having known or measured frequency components, and then to measure the magnitude of the output signal at frequencies which will be generated or enhanced by any nonlinear behavior.

As a simple example, if a single sinusoid of fixed amplitude and frequency F is applied as an input signal to the cell, the magnitude of the output measured at frequency F provides a measure of the linear response of the system, while the magnitude of the output measured at frequency 2F provides a measure of the nonlinearity of the system. In practice, the periodic input signal may have a DC offset and may contain more than one input frequency.

During applying operation 204, a plurality of electrical output signals from the memory cell is measured. The plurality of electrical output signals result from the plurality of electrical input signals. The electrical output signals can be read as either current or resistance of the phase change material. As stated above, if three electrical input signals are applied during applying operation 204 then three electrical output signals are measured. If a continuum of electrical input signals are applied during applying operation 204 then a continuum of electrical output signals can be subsequently converted into a sequence of samples using a circuitry that may perform several integration and sampling steps. For example, if the electrical input signals are 0.2V, 0.5V, and 0.7V then currents 20 uA, 60 uA, and 100 uA may be measured as electrical output signals. Note that the values are only illustrative. After applying operation 204 is completed, control passes to calculating operation 206.

If a periodic input signal is used instead of a series of fixed-amplitude levels, then during applying operation 204, the plurality of output signals represents the amplitude of selected frequency components in the output signal, rather than DC measurements of the output given a plurality of DC input levels.

During calculating operation 206, an invariant component of the plurality of electrical output signals is calculated based on the plurality of electrical output signals. As stated above, the invariant component is dependent on the configuration of material in the memory cell and substantially independent of the resistance drift characteristic of the memory cell over a particular period of time.

In one embodiment of the invention, the temperature of the memory cell is measured. Such measurement may be performed with a temperature sensor mounted externally to a memory chip containing the memory cell, or preferably using a temperature sensor embedded within the memory chip and proximate the memory cell. Once the temperature is measured, calculating the invariant component of the plurality of output electrical signals includes factoring, at least in part, the temperature of the memory cell and the period of time.

After calculating operation 206 is completed, control passes to determining operation 212. During determining operation 212, the memory state of the memory cell is determined based on the invariant component. After determining operation 212 is completed the process flow ends.

Figure 3:
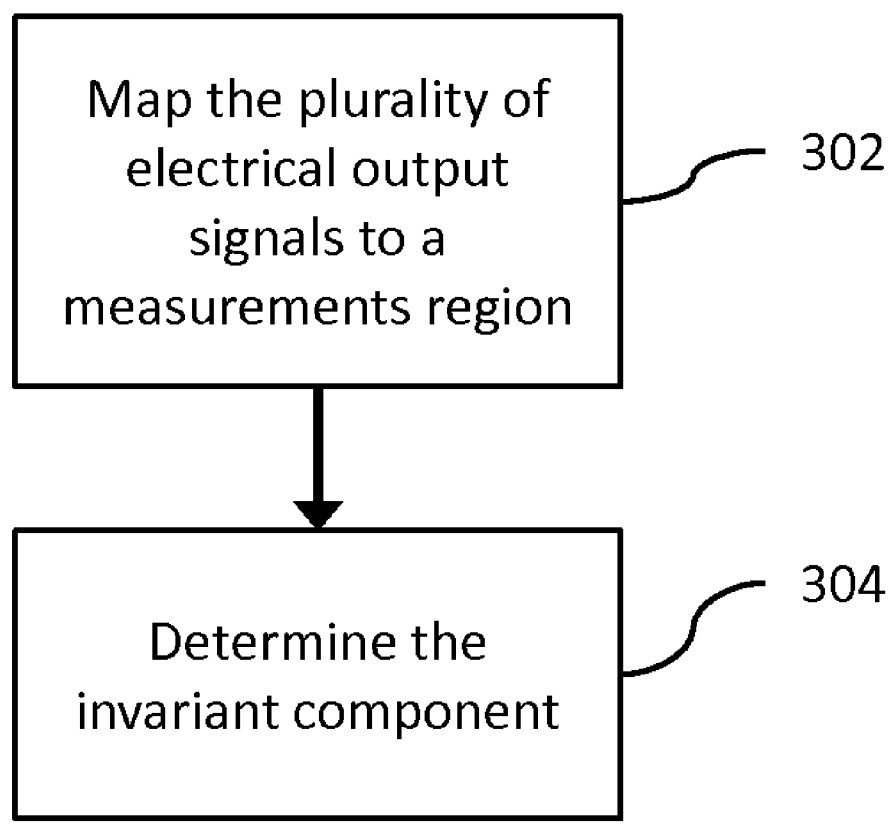
FIG. 3 shows a flowchart of one embodiment of the present invention for calculating an invariant component.

In one particular embodiment of the invention, shown in FIG. 3, calculating the invariant component includes mapping operation 302 and determining operation 304.

Calculating the invariant component begins at mapping operation 302. During mapping operation 302, the plurality of electrical output signals is mapped to one of a plurality of measurements regions. Each measurements region contains a multidimensional region of a multidimensional space. For example, if there are two electrical output signals then each measurements region is designated an area containing (x,y) coordinates on a 2-dimensional plane of possible measured values. If there are three electrical output signals then each measurements region is designated a volume containing (x, y, z) coordinates on a 3-dimensional volume of possible measured values. Each coordinate is based on the value of an individual electrical output signal. In other words, the plurality of measurements regions correspond to possible outcomes for the plurality of electrical output signals at different memory states of the memory cell.

Figure 4:
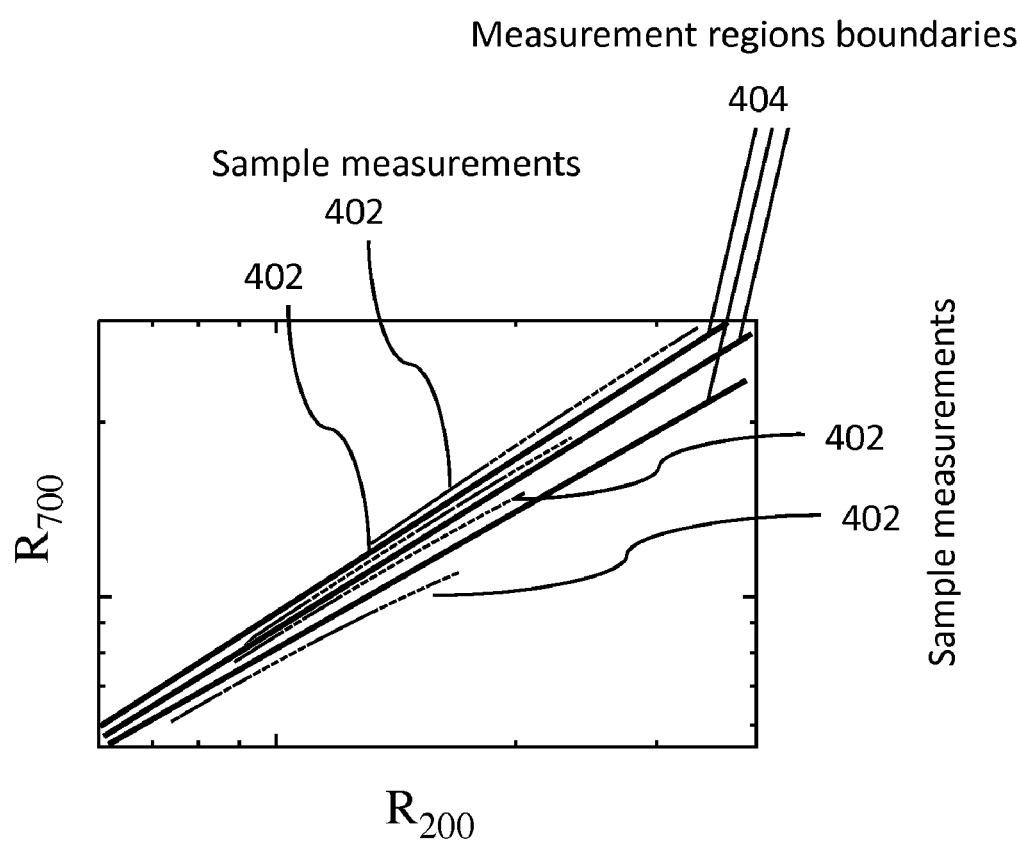
FIG. 4 shows an example of four measurement regions of a memory cell contemplated by the present invention.

In FIG. 4 an example of four measurement regions is shown. The R700 and R200 axes of the figure represent resistance measurements taken at 700 mV and 200 mV respectively. Also illustrated are sample measurements 402 with dotted lines. These sample measurements correspond to cells being programmed in four different initial states whose resistance drifts over time. As drift takes effect, the resistance measured 404 (shown as solid lines) using either of the two voltages increases at different rates. It can be seen from the figure that it is impossible to distinguish a cell's initial state by means of a single measurement once significant resistance drift occurs. Yet with two measurements and with the use of the measurement regions described herein, it is possible to correctly identify the state of a cell.

The measurements regions can be obtained through a variety of processes. The definition of the measurement regions can be done only sporadically (for example, at system memory installation time). The number of measurement regions that a memory can support may change depending on the quality of the memory and the operating conditions of the memory, among other factors. In one embodiment of the invention, the process for obtaining measurements regions includes accepting a desired number of distinct memory cell states (or memory states for short). Then the process includes programming at least one memory cell to each desired memory state. For each memory state, a plurality of electrical input signals is applied to the memory cell. From the plurality of electrical input signals for each memory state, a plurality of electrical output signals is measured from the memory cell preferably at multiple instances in time so that the resistance of cells changes as a result of drift. The process then associates the plurality of electrical output signals from each memory state with the memory state. A measurements region is assigned to each memory state such that each measurements region contains a substantial majority of the plurality of electrical output signals associated with the memory state. If this is not possible then the number of possible measurements regions is reduced so as to enlarge the measurements regions sizes.

Returning to FIG. 3, after mapping operation 302 is completed, control passes to determining operation 304. During determining operation 304, the invariant component is determined. The invariant component is determined to be equal to the particular measurements region in which the plurality of electrical output signals is mapped to. For example, in a one-bit phase change memory cell with two electrical output signals read as current, there are two measurements regions. A first measurements region contains all values above or equal to the line y=2x+150 and a second measurements region contains all values less than the line. If the plurality of electrical output signals have values of 90 uA and 200 uA, the invariant component is determined to be equal to the second measurements region. Note that the values are only meant to be illustrative. In exemplary embodiments, the values x, y, and z may represent the logarithm of a current. After determining operation 304 is completed, calculating operation 206 at FIG. 2 is completed and control passes to determining operation 212.

In one embodiment of the invention, determining the measurement regions includes programming at least one memory cell at least once into each of a plurality of possible initial states. Next, the plurality of input electrical signals are applied after each programming operation. The plurality of output electrical signals resulting from the plurality of electrical input signals are then measured at least one time during a period of time, so that cell drift is observed. The plurality of output electrical signals are associated with the possible initial states into which the at least one cell was programmed. Finally, one of the measurements regions is chosen for each of the plurality of possible initial states to contain a substantial majority of the plurality of output electrical signals associated with the desired initial state. If this is not possible, the number of measurement regions, and hence the number of states, is reduced and the choosing of the measurement regions procedure is restarted.

In the embodiments discussed so far, given the two or more measurements taken from the cell, a state of the cell is deduced via the calculation of a measurement region associated with the measurements. This type of information extraction methodology may be said to have a "hard decision" property in that a specific state of the cell is decided upon after obtaining the two or more measurements. More generally, great benefits may be obtained by avoiding making this hard decision on what it is believed the state of the cell, thereby employing what is known in the art as soft decisions. The idea of soft decisions is centered around the problem of computing the probability that a particular set of obtained measurements would be obtained conditional upon a particular (assumed) state having been programmed in the cell. This probability is obtained for every assumed initial state, and the resulting vector of probabilities summarizes the measurements taken on the cell. From this vector of probabilities one may calculate what is called the maximum likelihood estimate of the cell's state, which corresponds to choosing the initial state for which the calculated probability as above is largest. For this reason, this probability vector is referred to herein as the likelihood probability vector. If a probability distribution over the initial states can be assumed (for example the uniform distribution), another type of estimate called the maximum a posteriori (MAP) estimate may be obtained by combining the likelihood probability vector described above with the probability distribution over the initial states and the use of a probability and statistics tool called Bayes' rule. The MAP estimate selects the initial state that has the highest probability of being the correct state given the plurality of measurements. Computing an ML and MAP estimate and then disregarding the measurements is still within the realm of hard decision methods yet if the data stored is coded, that is, if the data has known redundancies, for example, it is employing an error control code, the likelihood probability vector can be very effectively combined with the error control code and the read data to greatly enhance the reliability of the cell's recovered state. There is a large body of literature that can be relied on to design systems that do this. The novelty in embodiments of the present invention lies in a novel combining of the concepts of the usage of multiple measurements to combat drift and the obtaining of the likelihood probability vector which then enables many statistical signal processing techniques to be applied effectively to Phase Change Memory.

Figure 5:
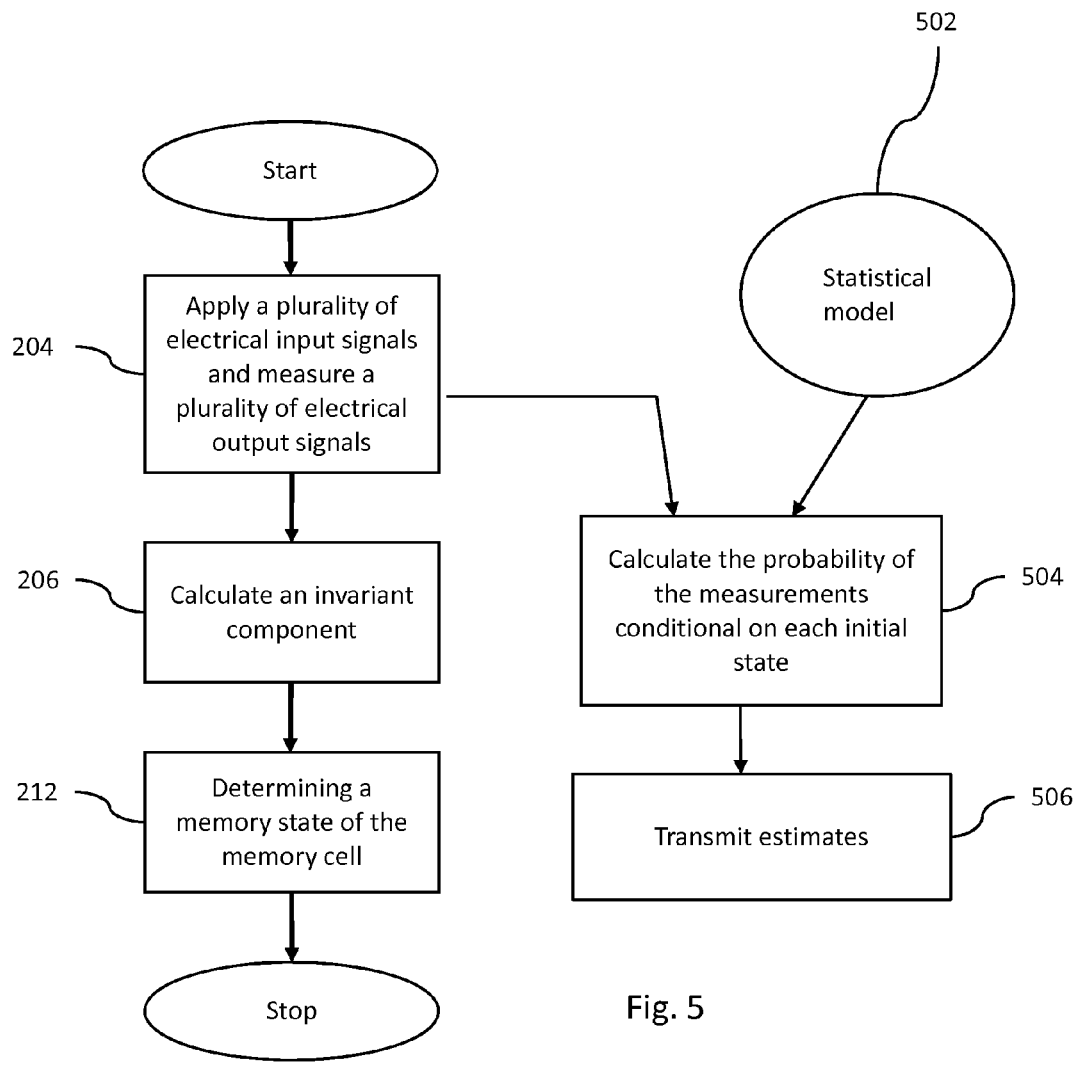
FIG. 5 illustrates an alternate embodiment of the present invention based on the existence of a drift and multilevel cell statistical model.

FIG. 5 illustrates an alternate embodiment of the present invention based on the existence of a drift and multilevel cell statistical model 502, which shall be described shortly. FIG. 5 is derived from FIG. 2 in which an additional step 504 of calculating the probability of the measurements conditional on every possible initial programmed state of the cell. These estimates are then transmitted 506 to a higher layer of processing which may use the likelihood probability vectors coming from a plurality of memory locations as well as an error control code in order to deduce with high reliability the states of the cells in the plurality of memory locations, according to techniques known in the art.

We now describe the steps which lead to the creation of the statistical model 502. A plurality of reference measurements is determined. Each reference measurement corresponds to a possible outcome for the plurality of electrical output signals at different memory states of the memory cell and at different times for measuring and at different temperatures. For example, in a one-bit phase change memory cell with two electrical output signals, a first reference measurement could be (100 uA, 150 uA), and a second reference measurement could be (50 uA, 100 uA). Again, the values are merely illustrative. Those skilled in the art will recognize that a variety of processes may be utilized to determine reference measurements. Examples of determining reference measurements include, but are not limited to, determining reference measurements during fabrication accounting for resistance drift, or determining reference measurements during read operations by sampling multiple memory cells at multiple times so as to account for drift.

Using the reference measurements, a statistical model that describes the probability of obtaining a given plurality of measurements after a given time, and at a given temperature when the cell has been programmed at a given state, can be obtained. Those skilled in the art will recognize that a variety of processes may be utilized to generate the statistical model. For example, the statistical model may be generated from known values during fabrication or by sampling multiple memory cells. A possible parametric statistical model may be used is to model drift as change in the logarithmic resistance domain that explains each of the plurality of multiple measurements as a linear function of the logarithm of time elapsed between programming and reading with an additional noise that may be modeled as a possibly colored Gaussian random process. That is, the noise at given time instance may depend on the noise at previous times instances. The parameters describing the linear function alluded to earlier as well as those of the Gaussian random process may extracted from the reference measurements, where the parameters will be generally a function of the initial programmed cell state as well as the reading temperature. The temperature at which the readings are being made are incorporated in the statistical model by adjusting the slope and variance introduced above.

Figure 6:
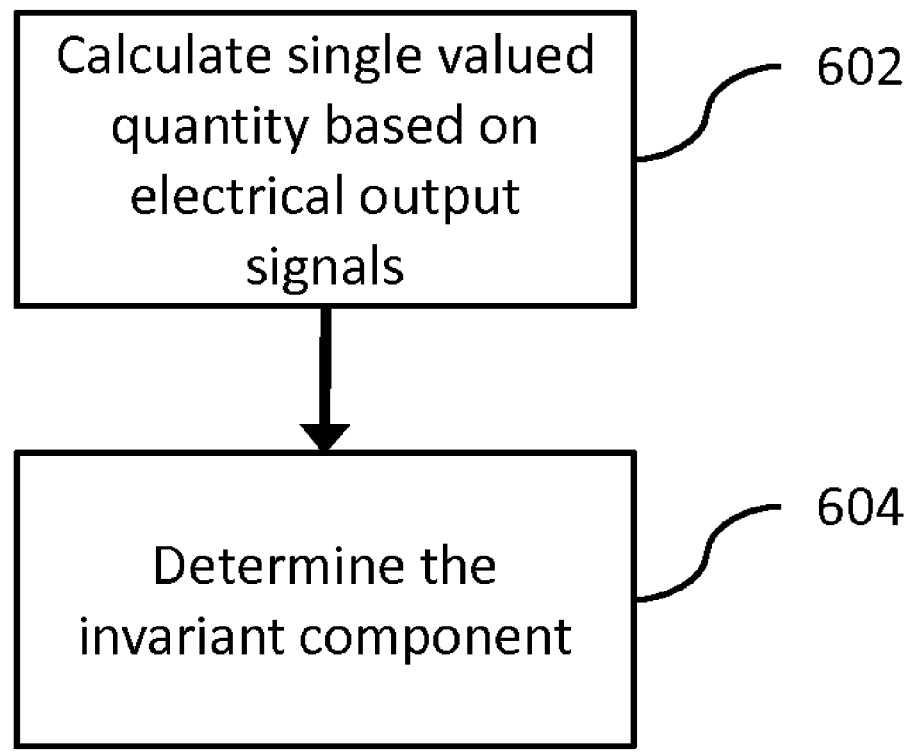
FIG. 6 shows a flowchart of another embodiment of the present invention for calculating an invariant component.

Turning to FIG. 6, yet another embodiment of the calculating operation 206 shown in FIG. 2 is illustrated. In this embodiment, calculating operation 206 includes mapping the plurality of measurements to a single valued quantity. For example, calculating operation 206 may further include calculating operation 602 and determining operation 604. Calculating operation 206 begins at calculating operation 602. During calculating operation 602, a single valued quantity is calculated based on the plurality of electrical output signals. The singled valued quantity corresponds to one of the memory states. Those skilled in the art will recognize that a variety of procedures may be utilized to calculate the singled valued quantity.

For example, a mathematical model may be utilized to solve a system of equations. The electrical behavior of a first phase of the memory cell may be mathematically modeled as a functional constraint $phi(E, I, a)=0$, where E is the electrical field vector signal, I is the current density vector signal and a is a set of parameters part of which may be subject to drift, and part of which may vary by temperature. The electrical behavior of a second phase of the memory cell may be mathematically modeled as a functional constraint $psi(E, I, b)=0$ where E is the electrical field vector signal, I is the current density vector signal and b is a set of parameters either practically stable with time (but that might depend on temperature) or measurable by other means. Next, the memory cell's current-voltage characteristic relation is modeled by means of a geometrical model accounting for the spatial distribution of the two phases of phase-change material which, based on phi and psi can be reduced by means of standard techniques pertaining to the field of electromagnetic and semiconductor theory to the steady state constraint $f(I, V, a, b, c)=0$ where I is the current V the voltage applied to the cell and a and b are as above and c is a set of parameters describing the spatial distribution of the two phases. Solving for c provides a singled valued quantity that gives the invariant component. In a particular embodiment, the method for obtaining the steady state constraint is based on finite elements methods. In a particular embodiment, the spatial distribution of the first and the second phase is as illustrated in FIG. 1, with a bottom contact, a layer of first phase (amorphous) and a layer of second phase (polycrystalline) and a top contact, the thickness of the first and second phase being the invariant parameters. In another particular embodiment, the first phase has a semi-spherical distribution on top of a bottom electrode surrounded by insulating material, whereas the second phase fills the remaining space and forming, jointly with the first phase a layer, on top of which a top electrode is found; the radius of the sphere and the total thickness of the layer being the invariant components. Those skilled in the subject will easily recognize that the present invention is not limited to a particular choice of spatial description of the PCM cell. In exemplary embodiments, the invariant component c can be computed using a combination of nonlinear solving techniques known in the art, and approximate nonlinear solving techniques known in the art, and standard linear fitting techniques known in the art, and standard nonlinear fitting techniques known in the art.

In a particular embodiment of the invention, the following mathematical models are utilized:

$phi(E, I, a)=a1*a \sin h(a2*I)-E$, where $a=(a1, a2)$;
$psi(E, I, a)=b*I-E$; and
$f(I, V, a, b, c)=c1*a1*a \sin h(a2*I)+c2*b*I-V$,
where $c=(c1, c2)$. This model may be used to describe a spatial distribution as in FIG. 1, also known as series model, where c1 is the thickness of the amorphous material and c2 is the thickness of the polycrystalline material.

Thus, the phase change memory cell's current-voltage characteristic relation is modeled as $V=c'*a*a \sin h(b*I)+c*I$, where V is a voltage drop across the phase change memory cell, I is a current passing though the phase change memory cell, a and b are dependent on the drift characteristic of the phase change memory cell, and c', c, either one of them or both can be the invariant component.

In another embodiment of the invention, the following mathematical models are utilized:
$phi(E, I, a)=a1*\sin h(a2*E)-I$, where $a=(a1,a2)$;

psi(E, I, a)=b*E−I; and f(I, V, a, b, c)=c1*a1*sin h(a2*V)+c2*b*V−I, where c=(c1, c2). This model may be used to describe a spatial distribution known as parallel model, where c1 is a surface parameter describing the effective cross section of the amorphous material and c2 is a surface parameter describing the effective cross section of the polycrystalline material.

Thus, the phase change memory cell's current-voltage characteristic relation is modeled as I=c'*a*sin h(b*V)+c*V, where V is a voltage drop across the phase change memory cell, I is a current passing though the phase change memory cell, a and b are dependent on the drift characteristic of the phase change memory cell, and c', c, either one of them or both can be the invariant component.

After calculating operation 602 is completed, control passes to determining operation 604. During determining operation 604, the invariant component is determined to be equal to the single valued quantity. After determining operation 604, calculating operation 206 is completed.

Figure 7:
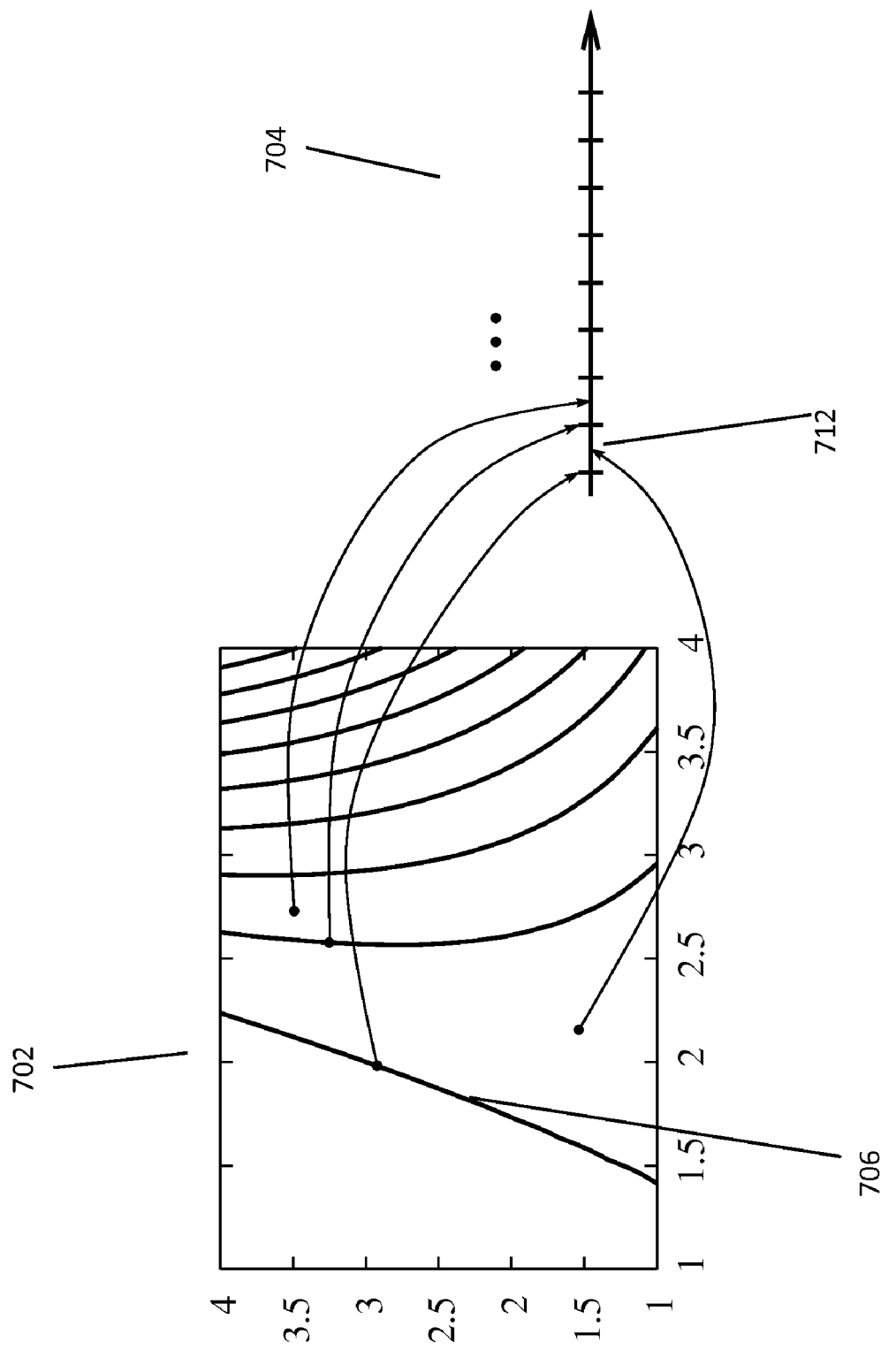
FIG. 7 illustrates a generic mapping of two measurements into a singled valued quantity, as contemplated by an embodiment of the present invention.

In FIG. 7 a generic mapping of two measurements into a singled valued quantity is demonstrated. The axes in the FIG. 702 represent possible values for the two measurements. The bold lines 706 within the figure represent points which are assigned to an identical singled valued quantity. The singled valued quantity may be interpreted with respect to a partitioned line 704 which has regions 712. Each of these regions 712 is meant to be associated with a cell state. If two measurements are mapped into a region 712 then we deduce that the cell state is that associated with the regions 712.

Figure 8:
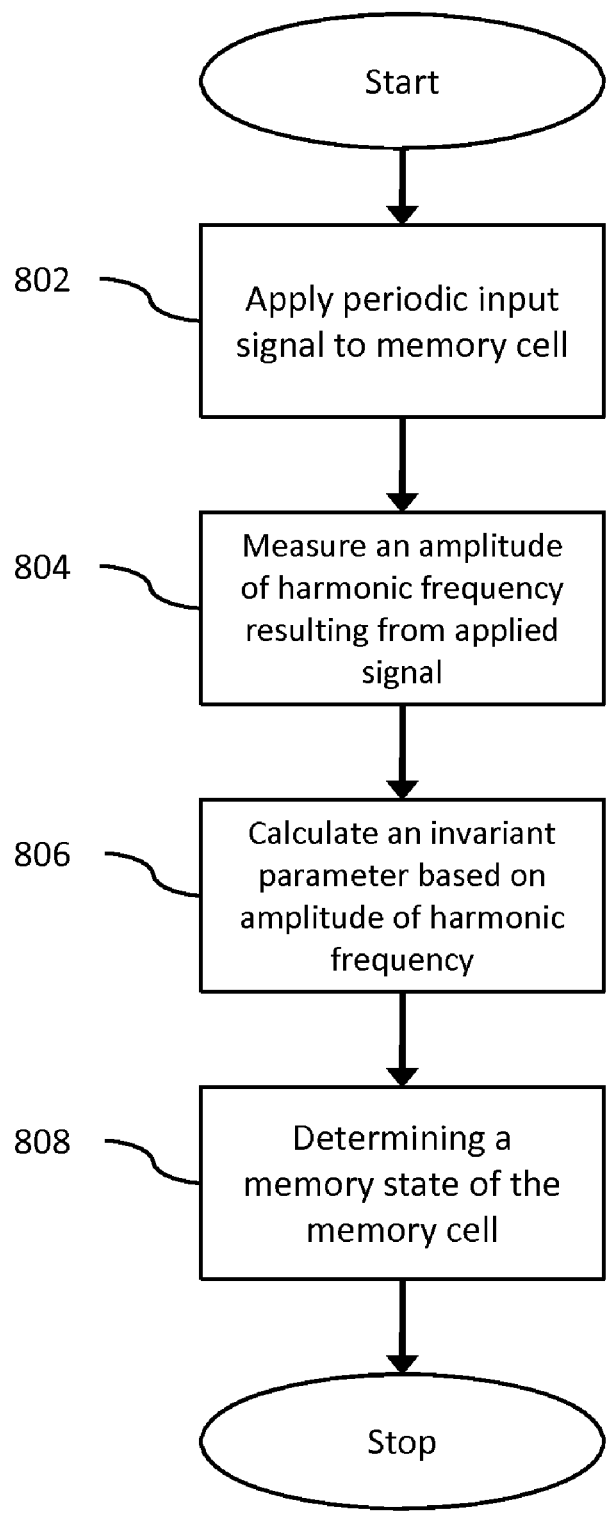
FIG. 8 shows a flowchart of another embodiment of the present invention for calculating an invariant component.
Figure 9:
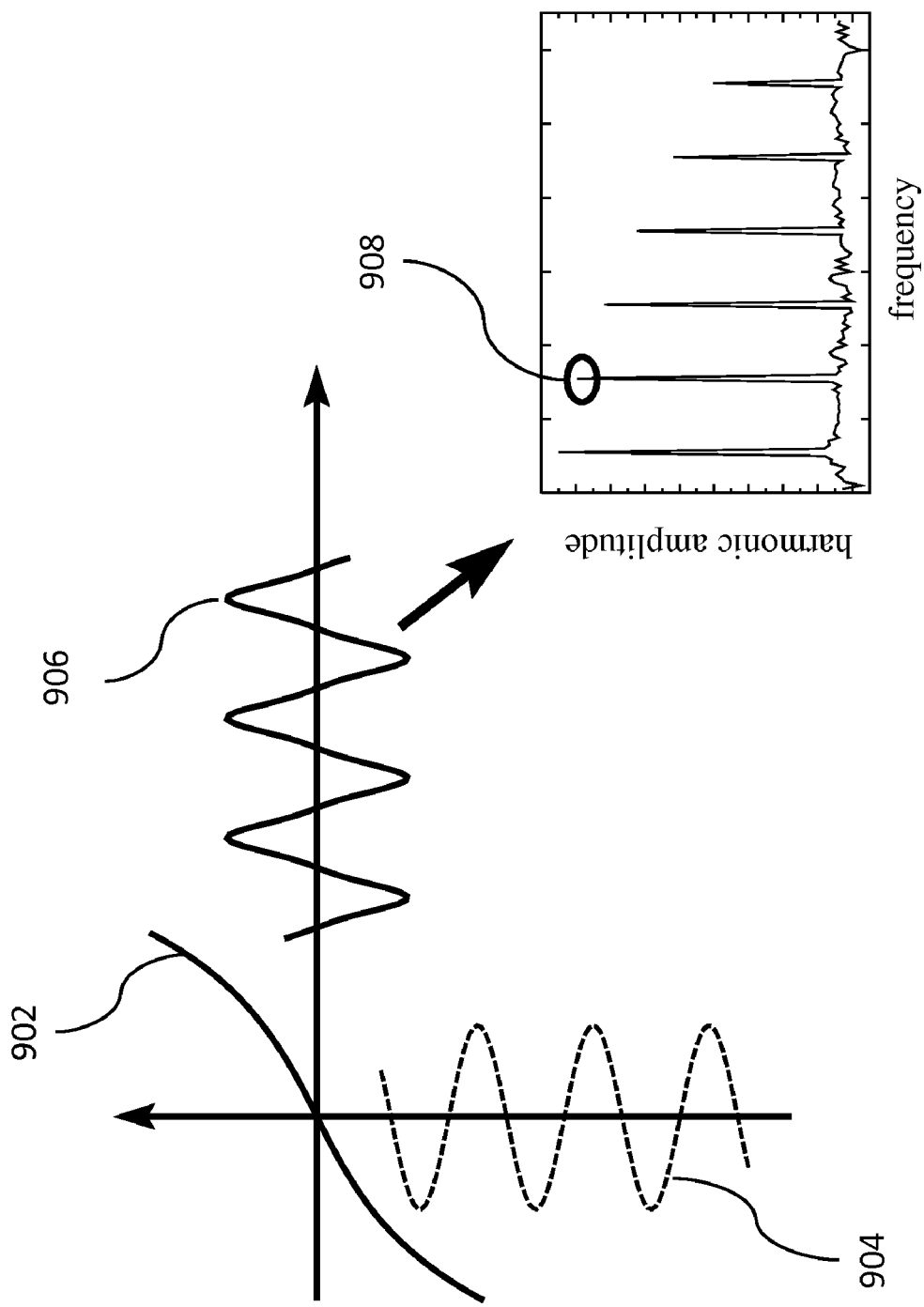
FIG. 9 illustrates application of at least one periodic input signal to a memory cell, as contemplated by an embodiment of the present invention.

FIG. 8, in conjunction with FIG. 9, illustrate an alternate embodiment of the present invention. This embodiment begins at applying operation 802. During applying operation 802, at least one periodic input signal 904 is applied to the memory cell. This periodic signal may have a zero or nonzero mean. The memory cell has an input/output characteristic relation 902 which may be nonlinear. Those skilled in the art will recognize a variety of methods for applying periodic input signals to the memory cell. After applying operation 802 is completed, control passes to measuring operation 804, which measures the output 906.

During measuring operation 804, an amplitude of at least one harmonic frequency 908 resulting from each periodic input signal 904 applied is measured. After measuring operation 804 is completed, control passes to calculating operation 806.

During calculating operation 806, the invariant component is calculated. In this embodiment of the invention, the invariant component is dependent on the amount of amorphous material in the memory cell. Those skilled in the art will recognize that a variety of methods may be utilized to calculate the invariant component. In one embodiment of the method, the cell may be modeled as in FIG. 1, where a layer of amorphous material is covered by a layer of polycrystalline material. Assuming a periodic voltage signal is applied to the cell, and assuming that the influence of the presence of polycrystalline material is negligible, the current is described by the following: I=a*sin h(b*V), where I is the instantaneous current, V is the instantaneous voltage and a and b are parameters describing both the configuration of the amorphous material and its electrical characteristics. A voltage signal V(t)=cos(w0*t) is applied to the cell, where t is the time and w0 is the base angular frequency. The frequency components of the current I(t) are then measured by means of standard techniques, such as, for example a tight filtering around a finite number of multiples of the frequency w0 followed by a signal amplitude extraction and quantization circuitry. The extracted frequency components f1, f2, etc. are then used to compute an invariant component. Invariant components may be extracted analytically or numerically based on the model. A possible method is to compute the Tayoor series expansion of the I/V relation of the model and to use standard analysis techniques to map each series coefficient into each of the f1, f2, etc. Other approximate method may include using f3 as invariant component. More generally, the result of the computation of the harmonic frequency amplitudes may be interpreted as the multiple measurements that have been extensively discussed throughout this embodiment. As a result, all of the techniques described herein for the processing of the multiple measurements to obtain an invariant component and in turn to deduce a cell's state apply to the case where a periodic signal is input to the cell and harmonic frequency amplitudes are measured. Thus the concept of measurement regions and the mapping into single valued quantities extends to this case. In a particular embodiment, each possible memory cell state is assigned a value of the invariant component. After calculating operation 806 is completed, control passes to determining operation 808.

During determining operation 808, the memory state of the memory cell is determined based on the invariant component. As discussed above, various methods may be used to determine the memory state of the memory cell based on the invariant component. After determining operation 708 is completed, the process flow ends.

Figure 10:
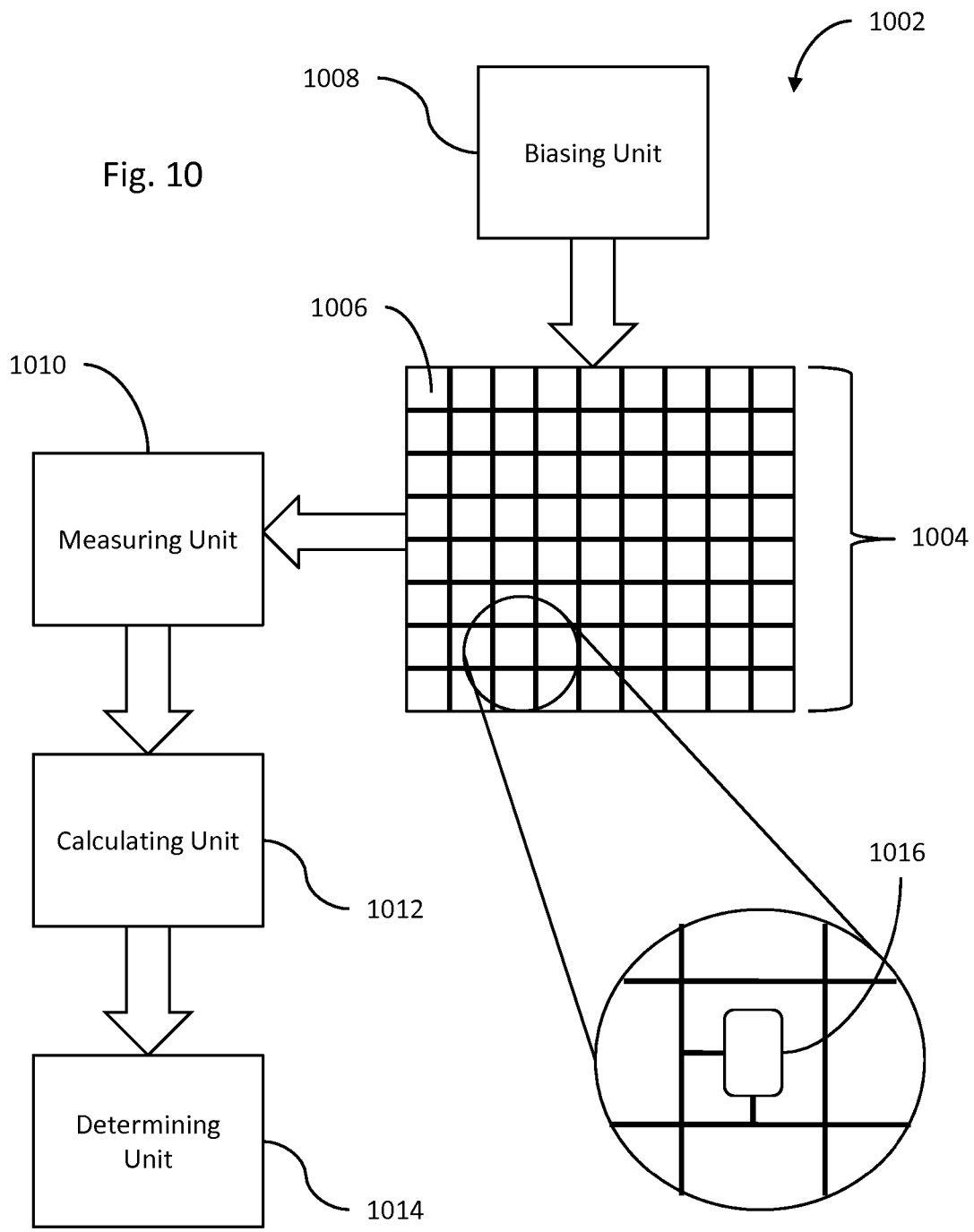
FIG. 10 illustrates a phase change memory device, memory controller and memory array contemplated by the present invention.

Turning to FIG. 10, an embodiment of a memory device, memory controller 1002 and a memory array 1004 is illustrated. The memory controller 1002 includes a biasing unit 1008, a measuring unit 1010, calculating unit 1012, and a determining unit 1014. The memory array 1004 includes a plurality of memory cells 1006.

Each memory cell 1006 includes phase change material 1016. The phase change material 1016 represents a memory state by a configuration of amorphous material in the memory cell, with the resistance of the memory cell drifting over a period of time.

The controller 1002 is configured to (a) receive an address specifying a memory location to be read; (b) select the memory cell specified; (c) apply a plurality of electrical input signals to the memory cell; (d) measure a plurality of electrical output signals from the memory cell resulting from the plurality of electrical input signals; (e) calculate an invariant component of the plurality of electrical output signals dependent on the configuration of amorphous material in the memory cell, the invariant component being substantially independent of a resistance drift characteristic of the memory cell over the period of time; and (f) determine a memory state of the memory cell based on the invariant component.

In one embodiment of the invention, the biasing unit 1008 is configured to bias the memory cells 1006 with the plurality of electrical input signals. As stated above, the electrical input signals can bias the memory cells 1006 at more than one point of the phase change memory cell's current-voltage characteristic relation or is part of a continuous input signal applied to the phase change memory cell 1006. In an alternate embodiment of the invention, the biasing unit 1008 is configured to apply the periodic input signal.

In one embodiment of the invention, the measuring unit 1010 is configured to measure the plurality of electrical output signals from the memory cell 1006 resulting from the plurality of electrical input signals. The measuring unit 1010 can be configured to measure the plurality of electrical output signals as a plurality of distinct electrical output signals or a continuum of electrical output signals. In an alternate embodiment of the invention, the measuring unit 1010 measures the amplitude of the harmonic frequency resulting from the periodic input signal.

In one embodiment of the invention, the calculating unit 1012 is configured to calculate an invariant component of the plurality of electrical output signals. The invariant component is dependent on the configuration of amorphous material in the memory cell 1006 and substantially independent of the resistance drift characteristic of the memory cell 1006 over the period of time. As stated above, the calculating unit 1012 may calculate the invariant component with a variety of methods. The calculating unit 1012 can calculate the invariant component by mapping the electrical output signals or the amplitude of the harmonic frequency to measurements regions, compute the probability that the invariant component of the plurality of electrical output signals or invariant component of the amplitude of the harmonic frequency corresponds to one of the memory states, or by solving a system of equations for the measurements value equal to the invariant component.

In one embodiment of the invention, the determining unit 1014 is configured to determine the memory state of the memory cell based on the invariant component.

Those skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

What is claimed is:

1. A method for operating a memory cell, a memory state of the memory cell being represented by a configuration of amorphous material in the memory cell, a resistance of the memory cell drifting over a period of time, the method comprising:
    applying a plurality of electrical input signals to the memory cell;
    measuring a plurality of electrical output signals from the memory cell resulting from the plurality of electrical input signals;
    calculating an invariant component of the plurality of electrical output signals dependent on the configuration of amorphous material in the memory cell, the invariant component being substantially independent of a resistance drift characteristic of the memory cell over the period of time; and
    determining a memory state of the memory cell based on the invariant component.

2. The method of claim 1, wherein the plurality of electrical input signals bias the memory cell at more than one point of the memory cell's current-voltage characteristic relation.

3. The method of claim 1, wherein calculating the invariant component comprises:
    mapping the plurality of electrical output signals to a measurements region containing the plurality of electrical output signals, the measurements region being one of a plurality of measurements regions, each measurements region of the plurality of measurements regions corresponding to a possible memory state of the memory cell; and
    determining the invariant component to be equal to the measurements region to which the plurality of electrical output signals is mapped.

4. The method of claim 3, wherein the measurement regions are determined according to the steps of:
    programming at least one memory cell at least once into each of a plurality of possible initial states;
    applying the plurality of input electrical signals at least one time after each programming operation;
    measuring the plurality of output electrical signals resulting from the plurality of electrical input signals;
    associating the plurality of output electrical signals with the initial states into which the at least one cell was programmed; and
    choosing one of the measurements regions for each of the plurality of possible initial states to contain a substantial majority of the plurality of output electrical signals associated with a desired initial state.

5. The method of claim 1, further comprising:
    for each of a plurality of possible initial cell states, computing the probability of obtaining the plurality of measurements of electrical output signals conditional on said initial cell state based on a statistical model.

6. The method of claim 1, further comprising:
    measuring a temperature of the memory cell; and
    wherein the calculating an invariant component of the plurality of output electrical signals is dependent, at least in part, on the temperature of the memory cell and the period of time.

7. The method of claim 1, wherein calculating the invariant component comprises mapping the plurality of measurements of electrical output signals to a single valued quantity.

8. A memory controller for operating a memory cell, a memory cell state being represented by a configuration of amorphous material in the memory cell, a resistance of the memory cell drifting over a period of time, the memory controller comprising:
    a biasing unit configured to bias a memory cell with a plurality of electrical input signals;
    a measuring unit configured to measure a plurality of electrical output signals from the memory cell resulting from the plurality of electrical input signals;
    a calculating unit configured to calculate an invariant component of the plurality of electrical output signals dependent on the configuration of amorphous material in the memory cell, the invariant component being substantially independent of a resistance drift characteristic of the memory cell over the period of time; and
    a determining unit configured to determine a memory state of the memory cell based on the invariant component of the plurality of output electrical signals.

9. The memory controller of claim 8, wherein the plurality of electrical input signals bias the memory cell at more than one point of the memory cell's current-voltage characteristic relation.

10. The memory controller of claim 8, wherein the plurality of electrical input signals is part of a continuous input signal applied to the memory cell.

11. The memory controller of claim 8, wherein the calculating unit is further configured to:
    map the plurality of electrical output signals to a measurements region containing the plurality of electrical output signals, the measurements region being one of a plurality of measurements regions, each measurements region of the plurality of measurements regions corresponding to a possible memory state of the memory cell; and
    determine the invariant component to be equal to the measurements region to which the plurality of electrical output signals is mapped.

12. The memory controller of claim 8, wherein the calculating unit is further configured to, for each of a plurality of possible initial cell states, compute the probability of obtaining the plurality of measurements of electrical output signals conditional on said initial cell state based on a statistical model.

13. The memory controller of claim 8, wherein the calculating unit is further configured to:
   calculate a single valued quantity based on the plurality of electrical output signals, the single valued quantity being a value dependent on the configuration of amorphous material in the memory cell, each single valued quantity corresponding to one of the possible memory cell states; and
   determine the invariant component to be equal to the single valued quantity calculated from the plurality of electrical output signals.

14. A computer program product embodied in a computer usable memory comprising:
   computer readable program codes coupled to the computer usable medium for operating a memory cell, a memory cell state being represented by a configuration of amorphous material in the memory cell, a resistance of the memory cell drifting over a period of time, the computer readable program codes configured to cause the program to:
   apply a plurality of electrical input signals to the memory cell;
   measure a plurality of electrical output signals from the memory cell resulting from the plurality of electrical input signals;
   calculate an invariant component of the plurality of electrical output signals dependent on the configuration of amorphous material in the memory cell, the invariant component being substantially independent of a resistance drift characteristic of the memory cell over the period of time; and
   determine a memory state of the memory cell based on the invariant component.

15. The computer program product of claim 14, wherein the plurality of electrical input signals bias the memory cell at more than one point of the memory cell's current-voltage characteristic relation.

16. The computer program product of claim 14, further comprising computer readable program codes configured to cause the program to:
   map the plurality of electrical output signals to a measurements region containing the plurality of electrical output signals, the measurements region being one of a plurality of measurements regions, each measurements region of the plurality of measurements regions corresponding to a possible memory state of the memory cell; and
   determine the invariant component to be equal to the measurements region to which the plurality of electrical output signals is mapped.

17. The computer program product of claim 16, further comprising computer readable program codes configured to cause the program to:
   program at least one memory cell at one time into each of a plurality of possible memory states;
   for each possible memory state, apply a plurality of electrical input signals;
   for each possible memory state, measure a plurality of electrical output signals resulting from the plurality of electrical input signals;
   for each possible memory state, associate the plurality of electrical output signals with the memory state; and
   for each possible memory state, assign a measurements region for each of the plurality of memory states, the measurements region containing a substantial majority of the plurality of electrical output signals associated with the memory state.

18. The computer program product of claim 14, further comprises computer readable program codes configured to cause the program to for each of a plurality of possible memory states, compute a probability that the plurality of electrical output signals corresponds to the memory state.

19. The computer program product of claim 14, further comprising computer readable program codes configured to cause the program to:
   calculate a single valued quantity based on the plurality of electrical output signals, the single valued quantity being a value dependent on the configuration of amorphous material in the memory cell, each single valued quantity corresponding to one of the possible memory cell states; and
   determine the invariant component to be equal to the single valued quantity calculated from the plurality of electrical output signals.

20. The computer program product of claim 14, wherein the plurality of electrical input signals is part of a continuous input signal applied to the memory cell.

21. A memory device comprising:
   a plurality of memory cells, each memory cell including a memory state represented by a configuration of amorphous material in the memory cell, a resistance of the memory cell drifting over a period of time; and
   a controller configured to:
   (a) receive an address specifying a memory location to be read;
   (b) select the memory cell specified;
   (c) apply a plurality of electrical input signals to the memory cell;
   (d) measure a plurality of electrical output signals from the memory cell resulting from the plurality of electrical input signals;
   (e) calculate an invariant component of the plurality of electrical output signals dependent on the configuration of amorphous material in the memory cell, the invariant component being substantially independent of a resistance drift characteristic of the memory cell over the period of time; and
   (f) determine a memory state of the memory cell based on the invariant component.

* * * * *